United States Patent [19]

Bergdahl

[11] 4,419,660
[45] Dec. 6, 1983

[54] ELECTRIC FILTER EQUIPMENT
[75] Inventor: Bernt Bergdahl, Ludvika, Sweden
[73] Assignee: ASEA Aktiebolag, Väterås, Sweden
[21] Appl. No.: 274,140
[22] Filed: Jun. 16, 1981
[30] Foreign Application Priority Data
  Jul. 8, 1980 [SE] Sweden .................................. 8005008
[51] Int. Cl.³ ........................ G08B 21/00; H03H 7/10
[52] U.S. Cl. .................................. 340/653; 333/17 R; 361/113
[58] Field of Search ............ 340/653, 661; 333/17 R, 333/17 L, 17 M, 16 Z; 363/32, 39, 45, 47; 361/113, 86, 17, 15

[56] References Cited
U.S. PATENT DOCUMENTS

| | | | |
|---|---|---|---|
| 2,285,912 | 6/1942 | De Monte | 340/653 |
| 2,824,296 | 2/1958 | Hecht et al. | 340/653 |
| 3,210,671 | 10/1965 | Lofting | 340/653 X |
| 4,104,687 | 8/1978 | Zulaski | 361/17 |

Primary Examiner—John W. Caldwell, Sr.
Assistant Examiner—Daniel Myer
Attorney, Agent, or Firm—Pollock, Vande Sande & Priddy

[57] ABSTRACT

An electric filter, for example an harmonic filter in an HVDC convertor, has, in addition to the main filter, a low power model filter having the same frequency characteristic as the main filter. The model filter is supplied with a voltage which is a scaled-down version of the voltage appearing across the main filter. The currents in the main and model filters are sensed at corresponding places in the filters and compared. If a deviation occurs between the sensed currents in the main and model filters, an indicating signal is generated which indicates a deterioration in the performance of the main filter.

6 Claims, 2 Drawing Figures

ELECTRIC FILTER EQUIPMENT

TECHNICAL FIELD

This invention relates to electric filter equipment, and in particular, but not exclusively, to equipment for filtering off harmonics in the output of a static convertor.

DISCUSSION OF PRIOR ART

The filter equipment employed in an electric heavy current installation, for example the harmonic filter in a convertor plant, is often used to reduce current or voltage components which would otherwise interfere with signal or telecommunications equipment or cause operational disturbances in objects connected to a network fed from the installation. In these cases it is important that the filter always functions in a faultless manner. In the case of a narrow-band filter, even a small change of the reactance of a filter component may give rise to a considerable deterioration of the filter, and such a change may be easily caused by, for example, a fault in a capacitor element.

The invention relates to filter equipment of the kind referred to above which is provided with monitoring means which indicates a deterioration in the functioning of the filter, so that appropriate corrective measures can immediately be taken.

DISCLOSURE OF THE INVENTION

According to the invention electric filter equipment comprises, a main filter, a model filter with a frequency characteristic which is substantially the same as that of the main filter, supply means for supplying the model filter with a voltage which corresponds to the voltage appearing across the main filter, first and second current-sensing means arranged, respectively, to sense a current flowing through the main filter and a corresponding current flowing through the model filter, and means to sense a discrepancy between said two currents and to generate an indicating signal on the appearance of an unacceptable change in the operating state of the main filter.

Desirably the model filter is designed to operate at a small fraction of the power level at which the main filter operates.

Where the main filter includes a capacitor, the equipment may further comprise means for sensing the temperature of the said capacitor, and means for changing the capacitance of the corresponding capacitor in the model filter in dependence on the temperature, measured at the capacitor of the main filter, in such a way that the temperature dependence of the capacitor of the main filter is compensated for.

BRIEF DESCRIPTION OF DRAWING

The invention will be described in greater detail, by way of example, with reference to the accompanying drawing, in which.

DESCRIPTION OF THE PREFERRED EMBODIMENT

Figure 1:
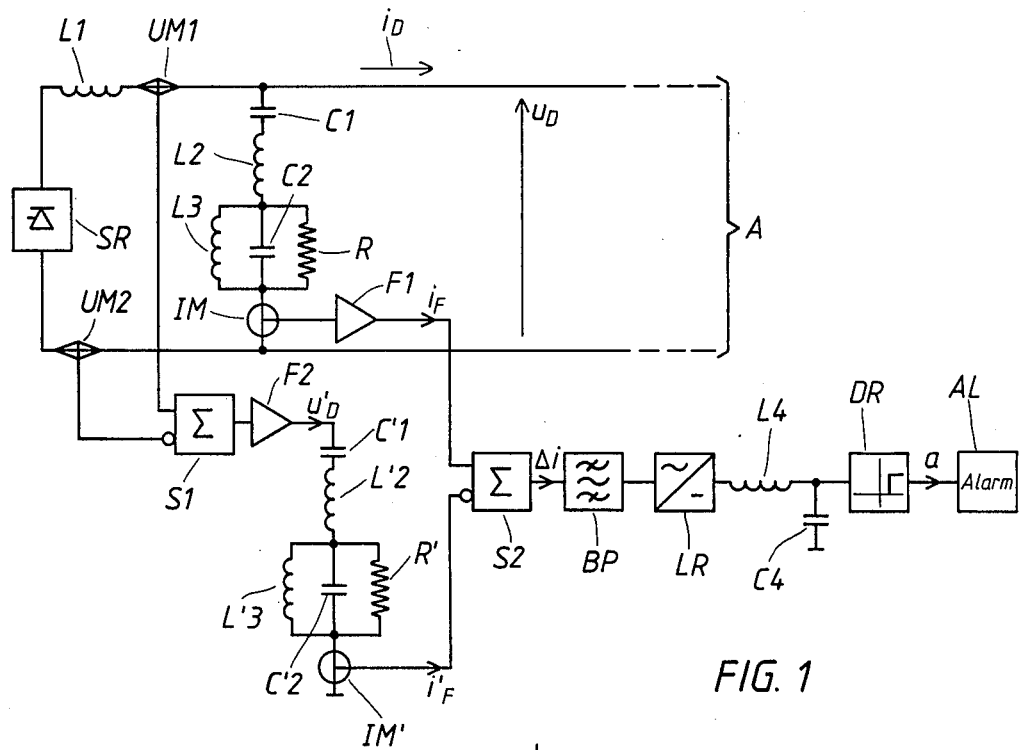
FIG. 1 shows one embodiment of filter equipment according to the invention in a high-voltage direct current (HVDC) convertor plant.

FIG. 1 shows an HVDC convertor SR, which is connected to a d.c. power line A. The current of the line is designated $i_D$ and its voltage $u_D$. The line A is provided, in a known manner, with a smoothing inductor L1 and an harmonic filter C1, C2, L2, L3, R, which is tuned to a certain frequency in the harmonic spectrum of the convertor, or to several of these frequencies. The filter consists of two capacitors C1 and C2, two inductors L2 and L3, and the resistor R. To supervise the operation of the harmonic filter, a model filter is provided. The model filter consists of two capacitors $C'1$, $C'2$, two inductors $L'2$ and $L'3$ and a resistor $R'$ and is constructed so as to have the same frequency characteristic as the main filter C1 ... R. The model filter is designed only for low power operation and is suitably constructed from conventional electronic components of low power type. It thus operates at a small fraction of the power level of the main filter.

In each of the two conductors which form the power line A, there is provided a voltage measuring device (UM1 and UM2, respectively), each of which consists, for example, of a capacitive voltage divider, the output signal of each of which devices is proportional to the instantaneous value of the voltage of the respective conductor with reference to ground potential. The difference between the output signals of the two measuring devices UM1 and UM2 is formed in a summation circuit S1, the output signal of which is thus proportional to the instantaneous value of the line voltage $u_D$. This output signal is transformed in an amplifier F2 to a suitable power level and voltage level (e.g. some twenty or thirty volts) and is supplied to the model filter $C'1$ ... $R'$ for supplying this with current. The signal is designated $u'_D$ in FIG. 1 and is a reproduction of the line voltage $u_D$.

A current measurement device IM is arranged for measuring the current through the main filter C1 ... R and delivers, via an amplifier F1, a signal $i_F$ corresponding to the current through the main filter. In the corresponding position in the model filter $C'1$ ... $R'$, a current measurement device IM' is arranged for measuring the current $i'_F$ through the model filter. The amplifier F1 has an amplification factor which is related to the amplification factor of the amplifier F2 so that when the main filter is operating faultlessly $i_F = i'_F$. The two current measurement signals $i_F$ and $i'_F$ are supplied to a second summation circuit S2, the output signal $\Delta i$ of which is a measure of the difference $i_F - i'_F$. The signal $\Delta i$ is supplied via a band pass filter BP, to a rectifier LR. The filter BP is arranged only to pass signals at the frequency (or frequencies) to which the main and model filters are tuned. The output signal of the rectifier LR is supplied to a level discriminator DR which delivers an indicating signal a if the difference signal $\Delta i$ exceeds a predetermined value. Between the rectifier LR and the level discriminator DR a smoothing or delay circuit L4-C4 is provided to prevent the appearance of an indicating signal in the case of a short-lived or transient phenomenon for which corrective action is not required.

Figure 2:
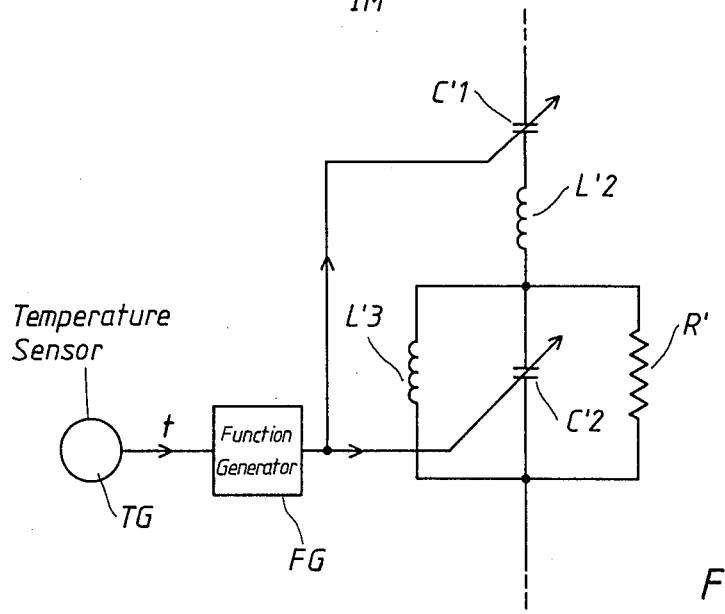
FIG. 2 shows how the capacitance of the model filter employed in the filter equipment of FIG. 1 may be changed to compensate for temperature-induced changes in the capacitances of the main filter.

A main filter of the type as shown in FIG. 1 is normally located in the open air and is thus subjected to considerable ambient temperature variations, which in turn give rise to variations in the impedance of the filter elements, for example to changes in the capacitance of the filter capacitors C1 and C2. If these temperature-induced changes are not compensated for, they could, in turn, give rise to the appearance of unwanted indicating signals a. To prevent this, a temperature measuring means TG is arranged, as shown in FIG. 2, to sense the ambient temperature (or the temperature of the capacitors in the main filter). The output signal t of the measuring means TG is supplied to a function generator FG, the output signal of which controls the capacitance of the capacitors C'1 and C'2 of the model filter. The function generator is designed so that the temperature dependence of the main filter is compensated for, that is, so that the frequency characteristics of the model filter closely correspond to those of the main filter even in the face of substantial temperature variations of the latter.

The invention may also be employed in other fields of applications than those mentioned above, and also in other types of filters than those already described. If several filters are employed in a piece of equipment, for example in a high voltage convertor, each filter may be provided with its own model filter and fault indicating equipment of the type shown in FIG. 1.

The sensing of the currents in the main and model filters may be carried out in a different way from that shown in FIG. 1. For example, the total currents flowing through the filters need not be sensed, but instead, the current flowing in some arbitrary branch where a current change would be expected to occur upon a typical fault in the filter, may be sensed.

FIG. 1 shows an arrangement in which the comparison between the currents flow in the main filter and the model filter is made by detecting the difference therebetween. Alternatively, the comparison can be made by forming the quotient, or in some other way. In FIG. 1 the comparison is made on the basis of amplitude, but alternatively the comparison can be made by comparing the phase positions of the currents flowing, respectively, in the main and model filters, or in some other way.

The band pass filter BP shown in FIG. 1 may be replaced by two band pass filters located before the summation circuit S2, or it may possibly be completely eliminated.

The indicating signal a may be used to actuate an alarm AL that the function of the main filter has deteriorated and, desirably, (in case of more than one filter) to indicate which filter is defective. Appropriate manual measures can then be taken, such as disconnection of the filter or by adjusting its tuning. Alternatively, the indicating signal a may be used to control an automatic adjustment of the tuning of the main filter(s), for example by connection or disconnection of auxiliary capacitor elements.

Other changes will occur to those skilled in the art, and all such changes within the scope of the following claims are intended to be embraced by the present invention.

What is claimed is:

1. In an HVDC converter plant having a pair of DC voltage output lines, a harmonic filter comprising:
   a main electrical harmonic filter connected between said output lines for suppressing harmonic signals;
   a model filter having a filter structure and frequency response substantially the same as said main electrical harmonic filter, and a power handling ability substantially less than said main electrical harmonic filter, said model filter connected to receive a fractional representative portion of the voltage on said output lines;
   means connected to structurally corresponding portions of said filters for providing first and second currents representing currents flowing through each of said filters; and
   means for sensing a difference between said first and second currents, said means generating an indicating signal when said difference changes whereby an unacceptable change in said main electrical filter is detected.

2. The harmonic filter of claim 1 wherein said means for sensing a difference between said first and second currents comprises:
   summation means for providing a signal proportional to the difference of said first and second currents;
   bandpass filter means for receiving said signal proportional to said difference; and
   a level discriminator connected to receive a signal from said bandpass filter, said level discriminator generating said indicating signal when said signal proportional to said difference exceeds a predetermined value.

3. A harmonic filter according to claim 1 in which means is provided for scaling one of said first and second currents whereby the currents after said scaling are equal during correct operation of said main filter.

4. A harmonic filter according to claim 1 wherein the indicating signal is generated in response to the difference between the first and second currents.

5. A harmonic filter according to claim 1 in which said main electrical harmonic filter and said model electrical filter are tuned to the same frequency range, and a band pass filter is provided for filtering the first and second currents to block signals therefrom lying outside said frequency range.

6. A harmonic filter according to claim 1 in which the main filter comprises a capacitor, and further comprises,
   means for sensing the temperature of said capacitor, and
   means for changing the capacitance of a corresponding capacitor in the model filter in dependence on the temperature measured at said capacitor of said main filter, whereby the temperature dependence of the capacitor of the main filter is compensated.

* * * * *